ELECTROMAGNETICALLY DRIVEN OSCILLATOR

Filed July 24, 1968 2 Sheets-Sheet 1

INVENTORS
TETSURO TANAKA
KIYOSHI BANSHO
BY
Wenderoth Lind and Ponack,
Attorneys

INVENTORS
TETSURO TANAKA
KIYOSHI BANSHO
BY
McGlew and Toren
Attorneys

United States Patent Office 3,522,554

Patented Aug. 4, 1970

3,522,554

ELECTROMAGNETICALLY DRIVEN OSCILLATOR

Tetsuro Tanaka, Kyoto, and Kiyoshi Bansho, Tokyo, Japan, assignors to Yazaki Corporation, Tokyo, Japan, a joint-stock company of Japan Filed July 24, 1968, Ser. No. 747,180
Claims priority, application Japan, Aug. 5, 1967, 42/50,046
Int. Cl. H03b *5/30*
U.S. Cl. 331—116 7 Claims

ABSTRACT OF THE DISCLOSURE

An electromagnetically driven oscillator includes two vibrating magnetic plates each having a center of symmetry. By forming the magnetic plates with respective different sizes so as to provide a difference of frequency, the electrical and mechanical coupling is increased to provide a high driving efficiency.

The present invention relates to an electromagnetically driven oscillator.

There are very many applications for a low frequency oscillator or vibrator, in both the electrical and mechanical fields. For example, such an oscillator or vibrator is used as an individual synchronizing oscillator for telegraphy and for facsimile transmission. A low frequency oscillator may also be used as the source of frequency for the carrier and signal of telemetry apparatus, and may also be used as an oscillator for precision measurement. A low frequency oscillator may also be used as a semi-standard oscillator and as the driving mechanism of a clock.

In these applications, a reed, a tuning fork, and a tuning loop are utilized as a low-frequency vibrator, in which a flexible vibration system is adopted with relation to natural frequency and size, and static electricity, electromagnets, dynamic electricity, and piezo-electricity are employed as a driving source. Such a conventional oscillator has defects that (1) the oscillator must be enlarged, in order to lower the resonance frequency and therefore, there is only a small possibility of producing a small-sized oscillator of low frequency; (2) mass-production is not available due to a delicate and troublesome manufacturing process requiring extreme precision; (3) fluctuation of frequency and steady loss effected by a thermal change must be carefully controlled for practical application of the oscillator; and (4) the oscillator is sensitive to external vibrations.

The object of the present invention is to provide an electromagnetically driven oscillator, with elimination of such defects, which is driven at high efficiency and formed in the smallest possible size and at low cost. The electromagnetic oscillator of the present invention is so constructed that there are provided two plate-like vibrators, each of which has two vibrating plates, and which are fixed, at their central portions on opposite sides of a magnetically driven base plate including permanent magnets and coils. Each vibrator is cut integrally and in a symmetrical configuration from a sheet of magnetic alloy plate serving to provide magnetic paths communicating between vibrating plates. The vibrators have respectively different sized vibrating plates to provide a difference of frequency, and a frequency equivalent to the difference between their frequencies derived from the coils.

For an understanding of the principles of the invention, reference is made to the following description of typical embodiments thereof as illustrated in the accompanying drawings.

FIGS. *7a–7d* are plan views illustrating various configurations of the vibrators of vibrator plates.

Figure 1:
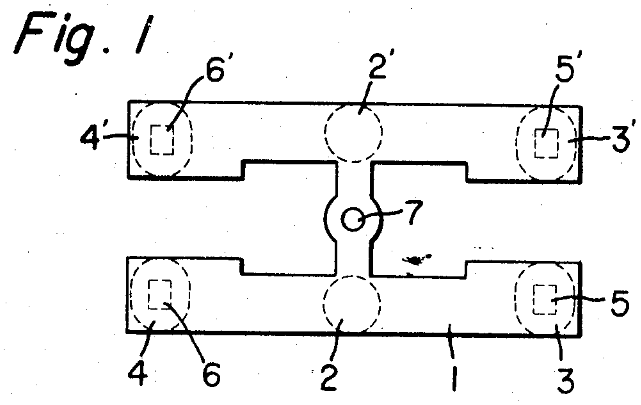
FIG. 1 is a plan view of a preferred embodiment of a vibrator in accordance with the present invention.
Figure 2:
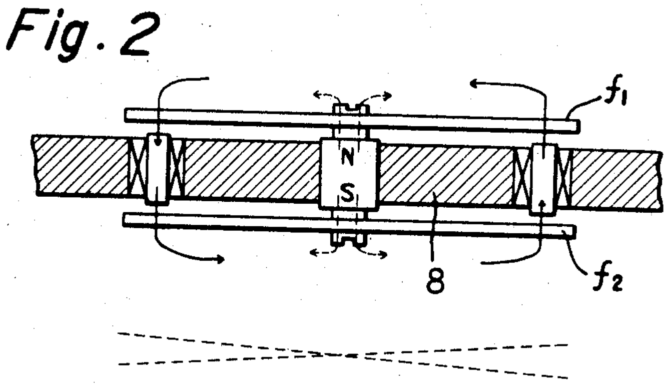
FIG. 2 is a vertical sectional view through the vibrator shown in FIG. 1.

In FIGS. 1 and 2, numeral 1 indicates vibrating or oscillating plates, each of which is cut integrally, and in a symmetrical configuration having a center of symmetry, from a flat sheet or plate of magnetic alloy. Plates 1 are mounted on lower and upper surfaces of a base plate 8 through a supporting member or post 7. Plates 1 are arranged symmetrically with respect to member or post 7. These two vibrators are located symmetrically and at equal spacings from the respective surfaces of base plate 8, as seen in FIG. 2. Numerals 2 and 2' are permanent magnets, which are fixed to the base plate 8 at the central portion of each of the vibrating plates and have opposite ends closely adjacent to the inside surfaces of the vibrating plates. Numerals 3, 3' and 4, 4' are coils wound on respective magnetic iron bars 5, 5' and 6, 6', mounted on base plate 8.

Figure 3:
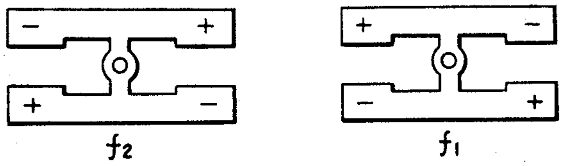
FIG. 3 is a plan view of the two vibrator plates, illustrating the relative magnetic polarities thereof.

FIG. 3 shows the magnetic polarity of two vibrators supported on opposite sides of the base plate 8, in which these two vibrating plates vibrate is phase opposition in a vertical direction in relation to the horizontal surfaces of the vibrating plates themselves. The mode of vibration is shown with dotted lines in FIG. 2. The two vibrators are formed of a similar material and in a similar configuration, but have a certain difference in their sizes, in order to provide a difference between their frequencies.

Figure 4:
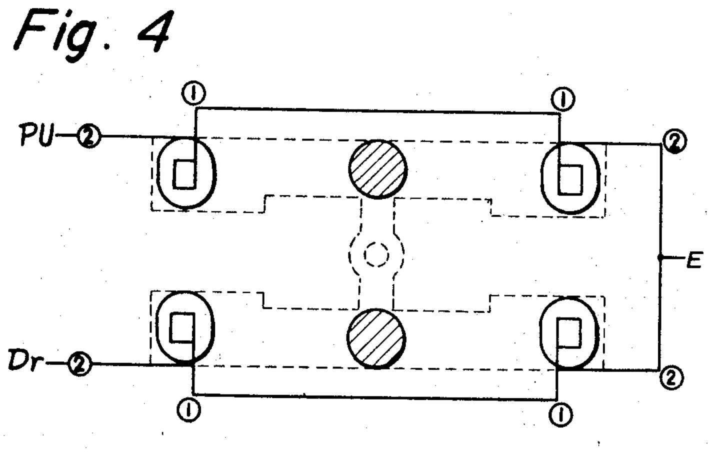
FIG. 4 is a schematic diagram of the connections of the coils.
Figure 5:
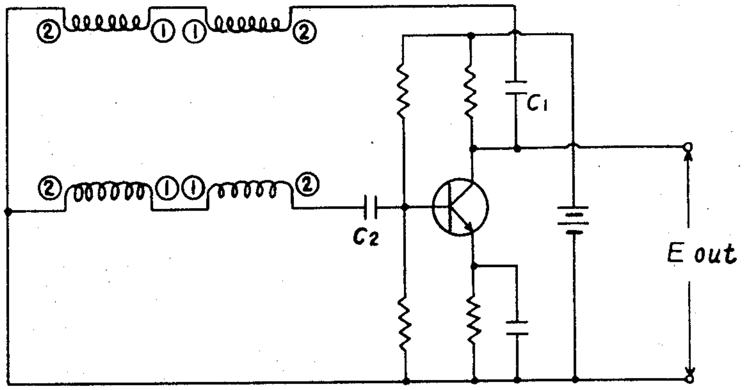
FIG. 5 is a schematic wiring diagram of the oscillation circuit.
Figure 6:
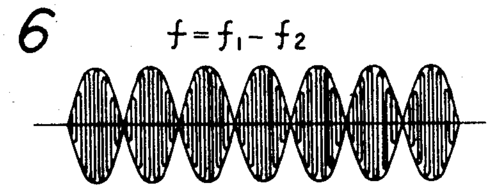
FIG. 6 is a diagrammatic illustration of the oscillation wave form.
Figure 7:
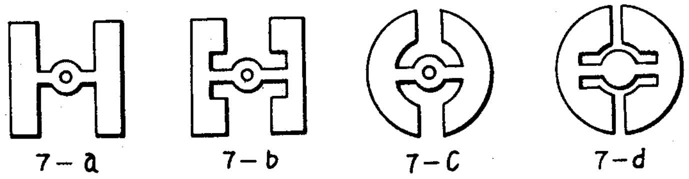

In FIG. 4, showing the connection of the coils, numerals 1 and 2 indicate a starting end and a terminal end, respectively. FIG. 5 shows an oscillation circuit, in which $C_1$ and $C_2$ are condensers for blocking flow of direct current into coils respectively disposed on a driving side and a pick-up side. In such a structure as shown in the drawing, a single transistor is sufficiently effective to drive, the oscillator, which can advantageously reduce power consumption. This is one of features of the present invention. FIG. 6 is an explanatory view of the wave form of the vibrations and FIGS. *7a–7d* illustrate examples of a vibrator plate.

The oscillator or vibrator so constituted as described hereinabove is driven in the following manner. When a switch connected to the electric source, in the oscillation circuit shown in FIG. 5, is put in the ON position, respective vibrating plates vibrate mutually is phase opposition in a vertical direction in relation to these two vibrating plates, and present a symmetrical amplitude of vibration. In other words, since each of the two vibrating plates is supported to be coupled at the central portion, a bending moment acts on the junction portion. The permanent magnets in this case act as follows: the permanent magnets have a bias direct current magnetic flux, as shown with dotted lines in FIG. 2, but do not pass alternating current magnetic flux, as shown with arrows with solid lines in the same drawings. Permeability of a permanent magnet is low, and in a structure in which a permanent magnet passes alternating current magnetic flux, resistance of a magnetic path increases, and the electrical and mechanical coupling coefficient decreases, to lower driving efficiency.

The oscillator in the present invention has a construction such that one vibrator serves to form a magnetic path for the other vibrator, and the permanent magnets do not pass alternating current magnet flux, so that electrical and mechanical coupling increases to give a high driving efficiency. In the oscillator of the present invention so constructed that the two vibrators are formed in respective different sizes so as to provide a difference of frequency, frequency equivalent to the difference in their frequencies is derived at each coil. That is, the value of the output frequency $f$ is obtained from the following formula, and at the output terminals of the oscillation circuit in FIG. 5:

$$f=f_1-f_2$$

The modulated wave form of vibration is as shown in FIG. 6.

The oscillator of the present invention constructed as described hereinabove has such characteristics that two vibrating or oscillating plates cut from a flat sheet of magnetic alloy plate can be produced by a simple manufacturing process, such as a punching means, and mass-produced at low cost. Minimization in size is possible to make a lowered frequency as one likes, and the oscillation circuit can be effectively driven by a single transistor, thereby reducing electricity consumption and manufacturing cost. The supporting and coupling means is simple but solid against external noise and vibration, and the oscillator itself is rigid and readily manufactured since reed lines and other coupling means are not employed.

What is claimed is:

1. An electromagnetically driven beat oscillator comprising, in combination, two vibrating plates each having a center of symmetry; a base plate; permanent magnets and coils mounted on said base plate; means securing each vibrating plate, at its center of symmetry, to a respective opposite surface of said base plate; each vibrating plate being divided into substantially identical halves interconnected by a coupling portion including the respective center of symmetry; said permanent magnets being arranged at opposite ends of the coupling portions of the two vibrating plates; said coils being arranged at opposite ends of the two halves of said vibrating plates; and circuit means, including said coils, operable to vibrate said plates in phase opposition in a direction perpendicular to said surfaces of said base plate and the surfaces of said vibrating plates, while imparting a bending moment to said coupling portions; the amplitude of vibration of said plates being symmetrical; one vibrating plate forming a magnetic path for the other vibrating plate; said vibrating plates having different respective frequencies of vibrations; and output means connected to said coils and deriving, from said coils, the frequency difference between the respective frequencies of said vibrating plates.

2. An electromagnetically driven beat oscillator, as claimed in claim 1, in which said vibrating plates have respective different sizes to provide said respective different vibration frequencies.

3. An electromagnetically driven beat oscillator, as claimed in claim 2, in which said circuit means includes an oscillator connected to said coils.

4. An electromagnetically driven beat oscillator, as claimed in claim 3, in which said vibrating plates serve to shunt alternating current magnetic flux from said permanent magnets.

5. An electromagnetically driven beat oscillator, as claimed in claim 1, in which said vibrating plates are substantially H-shape in plan including two congruent legs, each constituting one of said halves, and a cross bar interconnecting said legs, and constituting said coupling portion.

6. An electromagnetically driven beat oscillator, as claimed in claim 5, in which said legs are substantially rectilinear and have enlarged ends.

7. An electromagnetically driven beat oscillator, as claimed in claim 5, in which said legs form arcs of a circle.

References Cited

UNITED STATES PATENTS

| | | | |
|---|---|---|---|
| 2,594,794 | 4/1952 | Ehrat et al. | 58—23 |
| 3,107,481 | 10/1963 | Oram | 58—23 |

JOHN KOMINSKI, Primary Examiner

U.S. Cl. X.R.

58—23